(12) United States Patent
Kubo

(10) Patent No.: US 6,274,480 B1
(45) Date of Patent: Aug. 14, 2001

(54) METHOD OF FABRICATING SEMICONDUCTOR DEVICE

(75) Inventor: Akira Kubo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/392,661

(22) Filed: Sep. 9, 1999

(30) Foreign Application Priority Data

Sep. 10, 1998 (JP) .................................................. 10-257093

(51) Int. Cl.$^7$ ............................................. H01L 21/4763
(52) U.S. Cl. .................... 438/633; 438/629; 438/626; 438/645; 438/672; 438/691; 438/693; 438/734; 438/754
(58) Field of Search ..................................... 438/629, 626, 438/633, 645, 672, 691, 693, 734, 754

(56) References Cited

U.S. PATENT DOCUMENTS 4,992,135   2/1991   Doan .
5,662,769  * 9/1997   Schonauer ............................ 438/633

FOREIGN PATENT DOCUMENTS

| 5-275366 | 10/1993 | (JP) . |
| 6-302581 | 10/1994 | (JP) . |
| 9-153472 | 6/1997 | (JP) . |
| 9-162288 | 6/1997 | (JP) . |
| 10-56014 | 2/1998 | (JP) . |
| 10-98040 | 4/1998 | (JP) . |

* cited by examiner

*Primary Examiner*—John F. Niebling
*Assistant Examiner*—David Zarneke
(74) *Attorney, Agent, or Firm*—Sughrue, Mion, Zinn, Macpeak & Seas, PLLC

(57) ABSTRACT

There is provided a method of fabricating a semiconductor device, including the steps of (a) forming an insulating film on a semiconductor substrate, the insulating film being formed with a contact hole, (b) covering the insulating film with a metal film so that the contact hole is filled with the metal film, and (c) applying polishing such as CMP and wet-etching to the metal film to thereby pattern the metal film into a metal plug or a metal wiring layer. For instance, the insulating film is dipped into etchant or is exposed to vapor of etchant in the wet-etching. Since the insulating film is removed by wet-etching having a smaller removal rate than that of CMP, it is possible to minimize projection of a metal film, ensuring reliability of a semiconductor device.

21 Claims, 4 Drawing Sheets

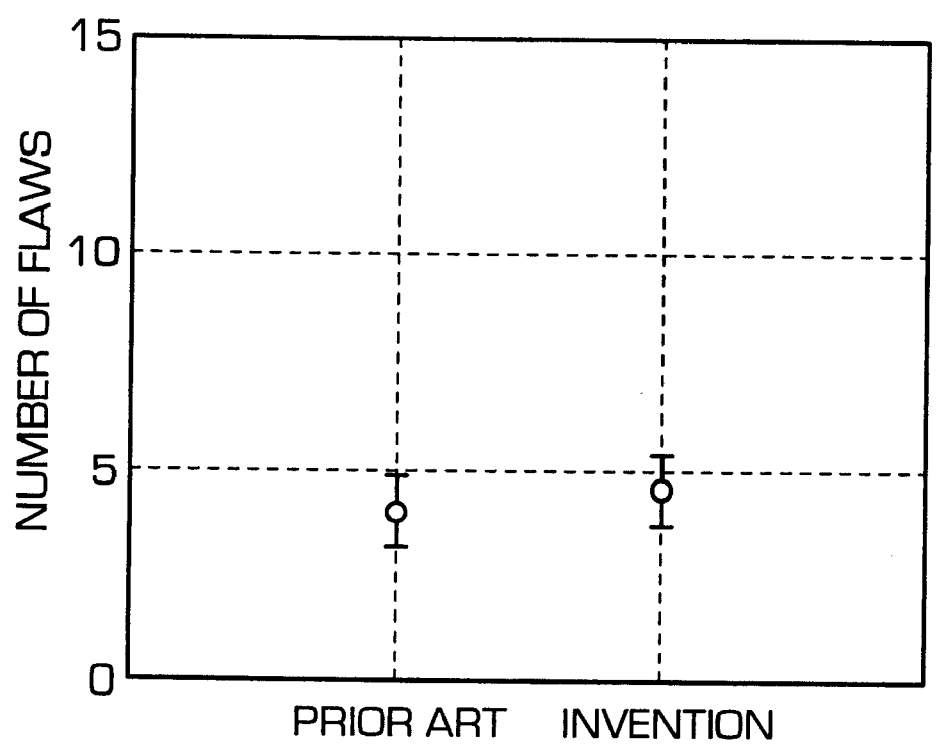

METHOD OF FABRICATING SEMICONDUCTOR DEVICE

BACKGROUND OF THE INVENTION

1. Field of the Invention

The invention relates to a method of fabricating a semiconductor device, and more particularly to such a method including the step of chemical mechanical polishing (CMP).

2. Description of the Related Art

There have been suggested methods of fabricating a semiconductor device, including a step of carrying out chemical mechanical polishing. For instance, Japanese Unexamined Patent Publication No. 5-275366 has suggested such a method. Hereinbelow is explained the method suggested in the Publication, with reference to FIGS. 1A to 1C.

First, there is fabricated such a wafer as illustrated in FIG. 1A. The illustrated wafer is comprised of a semiconductor substrate 1, an insulating film 2 formed over the semiconductor substrate 1 and composed of boron phospho silicate glass (BPSG), a wiring layer 4 formed on the insulating film 2, an oxide film 3 made by plasma and formed covering the wiring layer 4 and the insulating film 2 therewith, the oxide film 3 being formed with a contact hole reaching the wiring layer 4, a barrier metal film 5 formed on the oxide film 3 and covering an inner wall of the contact hole and an exposed surface of the wiring layer 4 therewith, and a tungsten film 6 deposited over the barrier metal film 5 and having a thickness of 1000 nm.

The tungsten film 6 is formed by chemical vapor deposition (CVD) for sufficiently filling the contact hole therewith. However, the tungsten film 6 may be formed by other methods.

Then, the tungsten film 6 is removed by CMP.

The wafer is placed on a polishing pad mounted on a rotary platen, and is polished by CMP through the use of slurry containing polishing particles such as $Al_2O_3$ and acid or base such as $H_2O_2$, KOH and $NH_4OH$. For instance, CMP is detailed in U.S. Pat. No. 4,992,135.

By polishing the tungsten film 6 by CMP, there is formed a tungsten plug 11 in the contact hole. However, the tungsten plug 11 is recessed at a surface thereof relative to a surface of the oxide film 3, as illustrated in FIG. 1B.

In order to eliminate a recess of the tungsten plug 11, the oxide film 3 is polished by CMP. In CMP, there is employed colloidal silica slurry containing $H_2O_2$ and KOH both of which selectively make reaction with the oxide film 3.

As illustrated in FIG. 1C, CMP is continued until the tungsten plug 11 projects over a surface of the oxide film 3. Thus, there is obtained a projected tungsten plug 12. The projected tungsten plug 12 provides enhanced electrical connection with a wiring layer to be formed above the tungsten plug 12.

However, the conventional method having been explained with reference to FIGS. 1A to 1C needed to carry out CMP twice. As a result, since it was necessary to prepare polishing materials such as polishing agent and polishing pad for carrying out the second CMP, the conventional method takes much time for polishing and needs much cost.

In addition, in the conventional method, since the second CMP is accomplished at a high polishing rate through the use of polishing agent which selectively makes reaction with the oxide film 3, a metal plug projects relative to a surface of the oxide film 3 as illustrated in FIG. 1C, which exerts harmful influence on planarization in subsequent steps.

Japanese Unexamined Patent Publication No. 10-98040 has suggested a method of fabricating a semiconductor device including the steps of polishing an interlayer insulating film formed on a substrate, by CMP, and introducing phosphorus into the interlayer insulating film prior to carrying out CMP or subsequently to carrying out CMP.

Japanese Unexamined Patent Publication No. 9-153472 has suggested method of washing a surface of a semiconductor substrate having been lanarized, including the step of radiating ultra-violet rays to a surface of the emiconductor substrate in water to thereby remove an organic compound layer having been formed on metal of which a buried wiring layer is composed.

Japanese Unexamined Patent Publication No. 10-56014 has suggested a method of polishing a substrate, including the steps of polishing a target formed on a substrate, by CMP, and applying plasma to a polished surface of the target.

Japanese Unexamined Patent Publication No. 9-162288 has suggested a method of forming a wiring layer, including the steps of forming a recess or a hole with an insulating film formed on a substrate, forming a first electrical conductor on an inner wall of the recess or hole so that a top edge thereof is located lower than a top edge of the insulating film, depositing an electrically conductive material which is different from the first electrical conductor, over the insulating film and the recess or hole, removing the first electrical conductor except the first electrical conductor located in the recess or hole, by polishing to be carried out through the use of polishing particles, and removing the polishing particles through the use of chemical.

Japanese Unexamined Patent Publication No. 6-302581 has suggested a method of etching an insulating film, including the steps of heating hydrofluoric acid solution to thereby generate hydrofluoric acid vapor, and supplying the hydrofluoric acid vapor to a cooled target to thereby etching a silicon dioxide film formed on the target.

The above-mentioned problem remains unsolved even by the method having been suggested in the above-mentioned Publications.

SUMMARY OF THE INVENTION

In view of the above-mentioned problem in the conventional methods, it is an object of the present invention to provide a method of fabricating a semiconductor device which method is capable of minimizing projection of a metal plug to be formed within a contact hole formed through an insulating film formed on a substrate.

There is provided a method of fabricating a semiconductor device, including the steps of (a) forming an insulating film on a semiconductor substrate, the insulating film being formed with a contact hole, (b) covering the insulating film with a metal film so that the contact hole is filled with the metal film, and (c) applying polishing and wet-etching to the metal film.

For instance, the metal film is patterned into a metal plug or a metal wiring layer in the step (c).

It is preferable that the polishing is chemical mechanical polishing (CMP).

For instance, the insulating film may be dipped into etchant or be exposed to vapor of etchant in the wet-etching. As the etchant, there is preferably used acidic etchant, and more preferably used hydrofluoric acid solution.

As polishing particles used in the polishing, there may be used alumina ($Al_2O_3$) particles, silica ($SiO_2$) particles or cerium dioxide ($CeO_2$) particles.

It is preferable that the metal film contains at least one of silicon (Si), tungsten (W), aluminum (Al) alloy, copper (Cu), and titanium (Ti) alloy.

There is further provided a method of planarizing a surface of an insulating film in which a metal plug or a metal wiring layer is buried, comprising the step of applying polishing and wet-etching to a metal film formed over the insulating film.

The advantages obtained by the aforementioned present invention will be described hereinbelow.

In the method of fabricating a semiconductor device, in accordance with the present invention, the steps of polishing and wet-etching are carried out when there is formed a metal plug or a buried metal wiring layer which has small projection beyond a surface of an insulating film.

In accordance with the method, the insulating film can be polished without generation of flaws at a surface thereof. In addition, since the insulating film is polished by means of etchant such as hydrofluoric acid solution and an etcher both of which have been used also in the conventional methods and without the use of further polishing agent and polishing pad, it would be possible to reduce fabrication cost.

Since the insulating film can be polished without generation of flaws, steps may be readily carried out subsequently to formation of a metal plug or a metal wiring layer, ensuring enhancement in planarization and reduction in a resistance of a metal wiring layer.

In the method in accordance with the present invention, CMP is not selected, but wet-etching is selected as the second polishing. Since wet-etching has a smaller polishing rate than that of CMP, it would be possible to minimize projection of a metal plug or a metal wiring layer, ensuring superior planarization.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 3 is a graph showing the number of flaws generated at a surface of an insulating film both in a conventional method of fabricating a semiconductor device and in a method of fabricating a semiconductor device in accordance with the first embodiment.

DESCRIPTION OF THE PREFERRED EMBODIMENTS

FIGS. 2A to 2D are cross-sectional views of a semiconductor device, illustrating respective steps of a method of fabricating a semiconductor device, in accordance with the first embodiment.

Figure 1A:
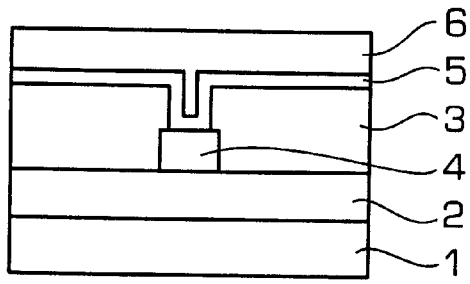
FIGS. 1A to 1C are cross-sectional views of a semiconductor device, illustrating respective steps of a conventional method of fabricating a semiconductor device.
Figure 1B:
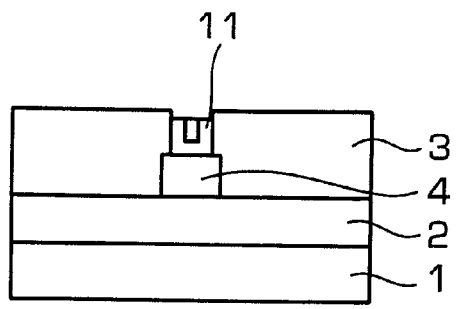
Figure 1C:
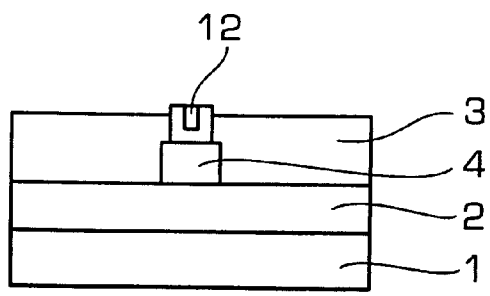
Figure 2A:
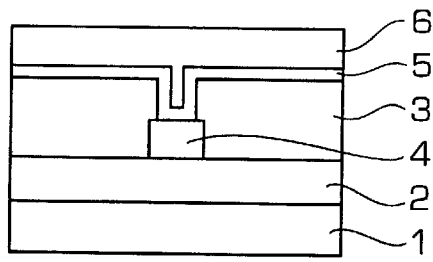
FIGS. 2A to 2D are cross-sectional views of a semiconductor device, illustrating respective steps of a method of fabricating a semiconductor device, in accordance with the first embodiment of the present invention.

First, there is fabricated such a wafer as illustrated in FIG. 2A. The illustrated wafer is comprised of a semiconductor substrate 1, an insulating film 2 formed over the semiconductor substrate 1 and composed of boron phospho silicate glass (BPSG), a wiring layer 4 formed on the insulating film 2, an oxide film 3 made by plasma and formed covering the wiring layer 4 and the insulating film 2 therewith, the oxide film 3 being formed with a contact hole reaching the wiring layer 4, a barrier metal film 5 formed on the oxide film 3 and covering an inner wall of the contact hole and an exposed surface of the wiring layer 4 therewith, and a tungsten film 6 deposited over the barrier metal film 5 and having a thickness of 500 nm.

The tungsten film 6 is formed by chemical vapor deposition (CVD) for sufficiently filling the contact hole therewith.

In the first embodiment, the barrier metal layer 5 is designed to have a two-layered structure including a titanium nitride (TiN) film having a thickness of 100 nm and a titanium (Ti) film having a thickness of 30 nm.

Figure 2B:
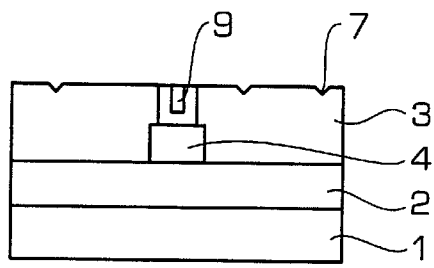

The wafer is polished through the use of polishing agent containing alumina ($Al_2O_3$) particles. The wafer is continued to be polished until the oxide film 3 located below the tungsten film 6 appears, as illustrated in FIG. 2B. Thus, there is formed a tungsten plug 9 in the contact hole. In the polishing, there are used a polishing pad having a two-layered structure including independent foam and successive foam, and polishing agent including iron nitrate as oxidant.

Since this polishing has a polishing rate of about 500 nm/min, the 500 nm-thick tungsten film 6 and the 130 nm-thick barrier metal film 5 are removed in about one minute and thirty seconds.

However, since the wafer is polished through the use of $Al_2O_3$ particles, there are generated flaws 7 at a surface of the oxide film 3. The flaws 7 have a depth of about 50 nm. The flaws 7 might allow entrance of foreign matters into the wafer and cause defect in registration in photolithography step. Hence, it is absolutely necessary to remove the flaws 7.

In order to remove the flaws 7, the following step is carried out.

Figure 2C:
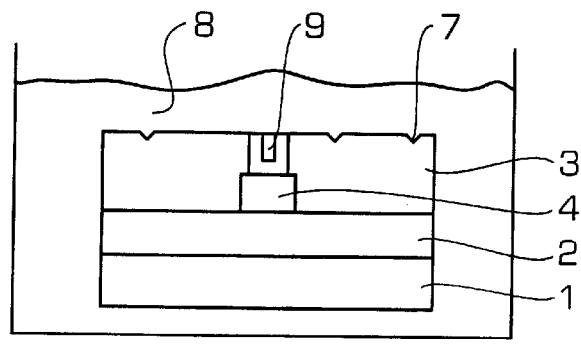
Figure 2D:
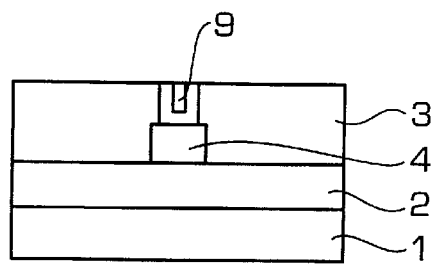

As illustrated in FIG. 2C, the wafer is dipped into 30%-hydrofluoric acid aqueous solution 8 just after the polishing. Then, the oxide film 3 is etched with the wafer being kept dipped in the 30%-hydrofluoric acid aqueous solution 8, until the tungsten plug 9 slightly projects beyond a surface of the oxide film 3, as illustrated in FIG. 2D.

Since the etching rate is equal to about 30 nm/min, it would take about 2 minutes in order to remove the flaws 7.

By etching the oxide film 3 for about 2 minutes, it is possible to minimize projection of the tungsten plug 9 which would exert harmful influence on planarization in subsequent steps.

FIG. 3 is a graph showing the number of the flaws 7 generated at a surface of the insulating film 3 both in the conventional method and in the method in accordance with the first embodiment.

The number of the flaws 7 per an area of 3 $mm^2$ of the insulating film 3 in the conventional method is in the range of 3.1 to 4.9. On the other hand, the number of the flaws 7 per an area of 3 $mm^2$ of the insulating film 3 in the method in accordance with the first embodiment is in the range of 3.5 to 5.3. This means that the method in accordance with the first embodiment can reduce the number of the flaws 7 down to the number in the conventional method.

Since the wet-etching in the method in accordance with the first embodiment can be carried out in a batch type apparatus unlike the conventional method, it would be possible to remarkably enhance a throughput.

In addition, since the wet-etching has a smaller polishing rate than that of the conventional method such as CMP, it would be possible to minimize projection of the tungsten plug 9 in the second polishing.

Furthermore, since the method in accordance with the first embodiment uses polishing materials which have been conventionally used, it would not be necessary to newly select optimum polishing agent and polishing pad, which ensures reduction in cost for fabricating a semiconductor device.

Though the metal plug 9 is formed in the first embodiment, it should be noted that the first embodiment might be applied to formation of a metal wiring layer.

FIGS. 4A to 4D are cross-sectional views of a semiconductor device, illustrating respective steps of a method of fabricating a semiconductor device, in accordance with the second embodiment.

Figure 4A:
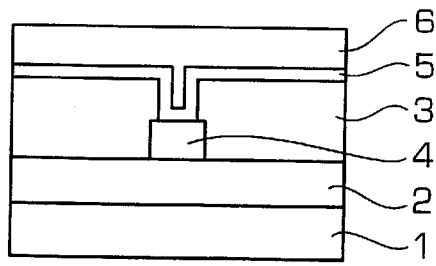
FIGS. 4A to 4D are cross-sectional views of a semiconductor device, illustrating respective steps of a method of fabricating a semiconductor device, in accordance with the second embodiment of the present invention.

First, there is fabricated such a wafer as illustrated in FIG. 4A. The illustrated wafer is comprised of a semiconductor substrate 1, an insulating film 2 formed over the semiconductor substrate 1 and composed of boron phospho silicate glass (BPSG), a wiring layer 4 formed on the insulating film 2, an oxide film 3 made by plasma and formed covering the wiring layer 4 and the insulating film 2 therewith, the oxide film 3 being formed with a contact hole reaching the wiring layer 4, a barrier metal film 5 formed on the oxide film 3 and covering an inner wall of the contact hole and an exposed surface of the wiring layer 4 therewith, and a tungsten film 6 deposited over the barrier metal film 5.

The tungsten film 6 is formed by chemical vapor deposition (CVD) for sufficiently filling the contact hole therewith.

Similarly to the first embodiment, the barrier metal layer 5 is designed to have a two-layered structure including a titanium nitride (TiN) film and a titanium (Ti) film.

Figure 4B:
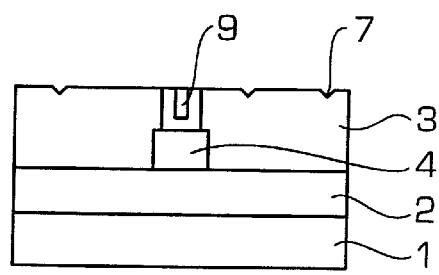

The wafer is polished through the use of polishing agent containing alumina ($Al_2O_3$) particles. The wafer is continued to be polished until the oxide film 3 located below the tungsten film 6 appears, as illustrated in FIG. 4B. Thus, there is formed a tungsten plug 9 in the contact hole. In the polishing, there are used a polishing pad having a two-layered structure including independent foam and successive foam, and polishing agent including iron nitrate as oxidant.

Since the wafer is polished through the use of $Al_2O_3$ particles, there are generated flaws 7 at a surface of the oxide film 3. The flaws 7 have a depth of about 50 nm. In order to remove the flaws 7, the following step is carried out.

Figure 4C:
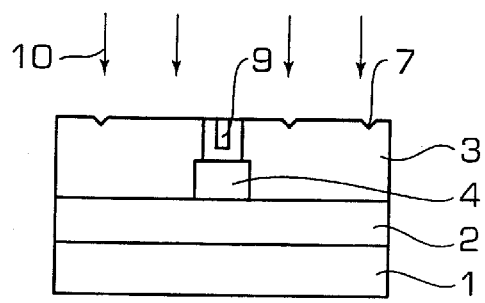
Figure 4D:
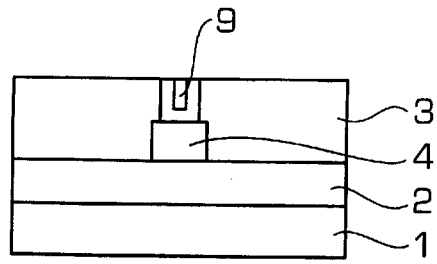

As illustrated in FIG. 4C, the wafer is exposed to vapor 10 generated from 30%-hydrofluoric acid aqueous solution just after the polishing. Then, the oxide film 3 is etched with the wafer being exposed to the vapor 10 of the 30%-hydrofluoric acid aqueous solution, until the tungsten plug 9 slightly projects beyond a surface of the oxide film 3, as illustrated in FIG. 4D.

The vapor 10 of the 30%-hydrofluoric acid aqueous solution is generated by heating a container containing hydrofluoric acid aqueous solution therein by means of a heater such as a hot plate.

In accordance with the second embodiment, the wafer is etched at low costs, because materials employed in the second embodiment are those having been conventionally employed, and in addition, it is possible to minimize projection of the tungsten plug 9 which would exert harmful influence on planarization in subsequent steps.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-257093 filed on Sep. 10, 1998 including specification, claims, drawings and summary is incorporated herein by reference in its entirety.

What is claimed is:

1. A method of fabricating a semiconductor device, comprising:

(a) forming an insulating film on a semiconductor substrate, said insulating film being formed with a contact hole;

(b) covering said insulating film with a metal film so that said contact hole is filled with said metal film;

(c) polishing said semiconductor device in the area where said metal film is formed until said metal film is substantially removed, thereby exposing said insulating film; and subsequently (d) wet-etching said insulating film until said metal film in said contact hole extends toward the surface of said semiconductor device at least to the level of said wet-etched insulating film.

2. The method as set forth in claim 1, wherein said metal film is patterned into a metal plug or a metal wiring layer in said step (c).

3. The method as set forth in claim 1, wherein said polishing is chemical mechanical polishing (CMP).

4. The method as set forth in claim 1, wherein said insulating film is dipped into etchant in said wet-etching.

5. The method as set forth in claim 1, wherein said insulating film is exposed to vapor of etchant in said wet-etching.

6. The method as set forth in claim 4, wherein said etchant is acidic etchant.

7. The method as set forth in claim 6, wherein said acidic etchant is hydrofluoric acid solution.

8. The method as set forth in claim 5, wherein said etchant is acidic etchant.

9. The method as set forth in claim 8, wherein said acidic etchant is hydrofluoric acid solution.

10. The method as set forth in claim 1, wherein polishing particles used in said polishing include at least one of particles composed of alumina ($Al_2O_3$), particles composed of silica ($SiO_2$), and particles composed of cerium dioxide ($CeO_2$).

11. The method as set forth in claim 1, wherein said metal film contains at least one of silicon (Si), tungsten (W), aluminum (Al) alloy, copper (Cu), and titanium (Ti) alloy.

12. A method of planarizing a surface of an insulating film in which a metal plug or a metal wiring layer is buried, comprising:

(a) polishing a film formed over said insulating film until said film is substantially removed, thereby exposing said insulating film; and subsequently (b) wet-etching said insulating film until said metal plug or said metal wiring layer extends toward the surface of said insulating film at least to the level of said wet-etched insulating film.

13. The method as set forth in claim 12, wherein said polishing is chemical mechanical polishing (CMP).

14. The method as set forth in claim 12, wherein said insulating film is dipped into etchant in said wet-etching.

15. The method as set forth in claim 12, wherein said insulating film is exposed to vapor of etchant in said wet-etching.

16. The method as set forth in claim 14, wherein said etchant is acidic etchant.

17. The method as set forth in claim 16, wherein said acidic etchant is hydrofluoric acid solution.

18. The method as set forth in claim 15, wherein said etchant is acidic etchant.

19. The method as set forth in claim 18, wherein said acidic etchant is hydrofluoric acid solution.

20. The method as set forth in claim 12, wherein polishing particles used in said polishing include at least one of particles composed of alumina ($Al_2O_3$), particles composed of silica ($SiO$), and particles composed of cerium dioxide ($CeO_2$).

21. The method as set forth in claim 12, wherein said film contains at least one of silicon (Si), tungsten (W), aluminum (Al) alloy, copper (Cu), and titanium (Ti) alloy.

* * * * *

UNITED STATES PATENT AND TRADEMARK OFFICE
CERTIFICATE OF CORRECTION

PATENT NO. : 6,274,480 B1
DATED : August 14, 2001
INVENTOR(S) : Akira Kubo

It is certified that error appears in the above-identified patent and that said Letters Patent is hereby corrected as shown below:

Column 2,
Line 9, delete "lanarized" insert -- planarized --;
Line 10, delete "emiconductor" insert -- semiconductor --

Column 8, claim 20,
Line 6, delete "(SiO)" insert -- ($SiO_2$) --

Signed and Sealed this

Twenty-sixth Day of February, 2002

Attest:

JAMES E. ROGAN
Attesting Officer
Director of the United States Patent and Trademark Office